US012755803B2

(12) United States Patent
Wang et al.

(10) Patent No.: US 12,755,803 B2
(45) Date of Patent: Oct. 6, 2026

(54) STORAGE ARRAY

(71) Applicant: Peking University, Beijing (CN)

(72) Inventors: Zongwei Wang, Beijing (CN); Yimao Cai, Beijing (CN); Yuhang Yang, Beijing (CN)

(73) Assignee: PEKING UNIVERSITY, Beijing (CN)

( * ) Notice: Subject to any disclaimer, the term of this patent is extended or adjusted under 35 U.S.C. 154(b) by 111 days.

(21) Appl. No.: 18/850,993

(22) PCT Filed: Jul. 24, 2023

(86) PCT No.: PCT/CN2023/108867
§ 371 (c)(1),
(2) Date: Sep. 25, 2024

(87) PCT Pub. No.: WO2024/259776
PCT Pub. Date: Dec. 26, 2024

(65) Prior Publication Data

US 2025/0149102 A1 May 8, 2025

(30) Foreign Application Priority Data

Jun. 20, 2023 (CN) ........................ 202310736845.6

(51) Int. Cl.
*G11C 7/00* (2006.01)
*G11C 27/00* (2006.01)

(52) U.S. Cl.
CPC .................................. *G11C 27/005* (2013.01)

(58) Field of Classification Search
CPC .................................. G11C 7/24; G11C 7/00
See application file for complete search history.

(56) References Cited

U.S. PATENT DOCUMENTS 5,265,060 A * 11/1993 Miyaoka .................. G11C 7/00 365/233.5
2023/0223089 A1* 7/2023 Lin ..................... G11C 13/0011 365/185.17

FOREIGN PATENT DOCUMENTS

CN 110663184 A 1/2020
CN 115701637 A 2/2023
(Continued)

OTHER PUBLICATIONS

International Search Report and Written Opinion in related International Application No. PCT/CN2023/108867, dated Jan. 17, 2024, 7 pages.

*Primary Examiner* — Jason Lappas
(74) *Attorney, Agent, or Firm* — GREENBLUM & BERNSTEIN, P.L.C.

(57) ABSTRACT

The present disclosure provides a storage array including memory cells arranged in a matrix array, each memory cell includes two memories, one P-channel field effect transistor and two N-channel field effect transistors alternately connected to the P-channel field effect transistor; a source of the P-channel field effect transistor is connected to a drain of a N-channel field effect transistor, a drain of the P-channel field effect transistor is connected to a source of the N-channel field effect transistor, and the two memories are respectively connected to the source of the P-channel field effect transistor and the source of the N-channel field effect transistor. The present disclosure can improve the density of the storage array and reduce the requirement for the drive capability of the field effect transistor.

8 Claims, 2 Drawing Sheets

(56) References Cited

FOREIGN PATENT DOCUMENTS

| | | | |
|---|---|---|---|
| CN | 1505043 | A | 6/2024 |
| KR | 10-1525796 | B1 | 6/2015 |

* cited by examiner

STORAGE ARRAY

CROSS REFERENCE TO RELATED DISCLOSURE

The present application is a US national stage application of PCT international application PCT/CN2023/108867, filed on Jul. 24, 2023, which claims priority to Chinese Patent Application with No. 202310736845.6, entitled "Storage Array", and filed on Jun. 20, 2023, the content of which is expressly incorporated herein by reference in its entirety.

TECHNICAL FIELD

The present disclosure relates to the field of semiconductor and Complementary Metal Oxide Semiconductor (CMOS) hybrid integrated circuit technology, and particularly to a Resistive Random Access Memory (RRAM) storage array circuit with a CMOS device.

BACKGROUND

With the development of artificial intelligence and deep learning technologies, artificial neural networks are widely used in fields such as natural language processing, image recognition, autonomous driving, and graph neural networks, etc. However, an increasing network size causes a large amount of energy to be consumed for data transfer between a memory and a conventional computing device such as a CPU or a GPU, which is referred to as the von Norman bottleneck. The computation that occupies the most important part of the artificial neural network algorithm is the Vector Matrix Multiplication (VMM) computation. The process-in-memory based on the non-volatile memory means that weight values are stored in non-volatile memory units, and analog vector matrix multiplication computation is performed on the array, thereby avoiding frequent data transfer between the memory and the computing units. Accordingly, the process-in-memory based on the non-volatile memory is considered as a promising way to break through the von Neumann bottleneck.

At present, a non-volatile memory device such as a Resistive Random Access Memory (RRAM), a Phase Change Random Access Memory (PCRAM), a Magnetic Random Access Memory (MRAM), a Ferroelectric Random Access Memory (FeRAM), and a Ferroelectric Field Effect Transistor (FeFET), etc., stores a weight value in a conductivity value of the device after the weight value is written. The devices are arranged in an array, and a voltage is inputted from one end as an input of the vector matrix multiplication. In the array, through the computation based on the Ohm's law and Kirchhoff's law, a current is obtained at the other end of the array, which is a summation result of the vector matrix multiplication, and the summation result is generally read out by using an analog-to-digital converter (ADC).

In the above-mentioned multiple novel non-volatile memories, the dual-port non-volatile memory is widely concerned and studied due to a higher theoretical density and a reduced process cost caused by a simple structure thereof. In the actual applications, the dual-port memory needs the formation of a storage array to implement a high-density structure and high-speed read/write. In the existing method, a 1-transistor-1 resistor (1T1R) array is mainly formed, and an N-type transistor is generally used in the mainstream method. However, in actual use, on the one hand, since a power supply Vdd at an advanced node is lower, a maximum gate voltage that can be applied to the transistor is limited, and on the other hand, a non-zero source voltage of the N-type transistor further reduces the gate-source voltage of the transistor when the N-type transistor has a source resistor. Accordingly, there exists a problem that a driving current is insufficient during the operation of the dual-port memory at the advanced node, thereby limiting a further reduction of a device size and limiting the improvement of the density of the storage array.

SUMMARY

In view of the above, the present disclosure provides a storage array to address the problems of voltage limitation in the existing storage circuits, resulting in insufficient driving current, limiting the miniaturization development of the device and the increasement of the density of the storage array.

In the present disclosure, a storage array is provided, including memory cells arranged in a matrix array, each memory cell comprising two memories, one P-channel field effect transistor and two N-channel field effect transistors alternately connected to the P-channel field effect transistor; a source of the P-channel field effect transistor is connected to a drain of a N-channel field effect transistor, a drain of the P-channel field effect transistor is connected to a source of the N-channel field effect transistor, the two memories are respectively configured to be connected to the source of the P-channel field effect transistor and the source of the N-channel field effect transistor.

Optionally, the memory cell comprises a first N-channel field effect transistor, a first P-channel field effect transistor, and a second N-channel field effect transistor connected in sequence; gates of the first N-channel field-effect transistor, the second N-channel field-effect transistor, and the first P-channel field-effect transistor are configured to be connected to different word lines respectively, a source of the first N-channel field-effect transistor and a source of the second N-channel field-effect transistor are connected to different source lines respectively.

Optionally, a source line is configured to be connected to a positive voltage VDD, a saturation current of the first P-channel field effect transistor is represented as follows:

$$I_{max} = \left(\frac{Kw}{L}\right)_p * (V_{sg} - V_{tp})^2,$$

where $$V_{sg} = V_s < VDD, \left(\frac{Kw}{L}\right)_p$$

and $V_{tp}$ represent inherent parameters of the first P-channel field effect transistor, $V_{sg}$ represents a source-gate voltage of the first P-channel field effect transistor, $V_s$ represents a source voltage of the first P-channel field effect transistor.

Optionally, the memories includes a first memory and a second memory, the first memory is configured to be connected to the source of the first P-channel field effect transistor, and the second memory is configured to be connected to the source of the second N-channel field effect transistor.

Optionally, the storage array includes M×N memory cells, where M represents the number of rows, N represents the number of columns, the word lines comprise a word line N connected to gates of the N-channel field effect transistors and a word line P connected to a gate of the P-channel field effect transistor; memory cells in the same row are configured to share the word line N and a bit line, and memory cells in the same column are configured to share the word line P and a source line.

Optionally, the storage array includes a storage mode, a write-1 mode, a write-0 mode, and a read mode; in the storage mode, each memory cell is configured to be in a non-operating state and maintain original data thereof, in the write-1 mode and the write-0 mode, specified memory cells are configured to be in a state-1 and a state-0 respectively, wherein voltages of the specified memory cells are less than a preset voltage VDD; in the read mode, a source line of a memory cell is configured to be connected to a read voltage to allow a read current to reach a bit line through the memory cell and read a corresponding state of the memory cell from the bit line.

Optionally, in the storage mode, all the word lines N, the bit lines, and the source lines are configured to be connected to GND, and the word line P is configured to be connected to the preset voltage VDD; the P-channel field effect transistor and the N-channel field effect transistors are configured to be in an off state.

Optionally, in the write-1 mode, the word line N is configured to be connected to the preset voltage VDD, and the word line P is configured to be connected to the GND; after a target memory cell is strobed, a source line of the target memory cell is configured to be connected to a preset write-1 voltage, a target bit line of the target memory cell is configured to be connected to the GND, the rest of the bit lines are configured to be connected to the write-1 voltage, and the target memory cell is configured to be written to the state-1.

Optionally, in the write-0 mode, the word line N is configured to be connected to the preset voltage VDD, the word line P and the source line are configured to be connected to the GND; after a target memory cell is strobed, a bit line of the target memory cell is configured to be connected to a preset write-0 voltage, source lines of other memory cells are configured to be connected to the preset write-0 voltage, a write current flows from the bit line through the target memory cell to the source line, and the target memory cell is configured to be written to the state-0.

Optionally, in the read mode, the word line N is configured to be connected to the preset voltage VDD, and the source line is configured to be connected to the read voltage; after a target memory cell is strobed, a read current flows from the source line through the target memory cell to the bit line, and a corresponding state of the memory cell is read from the bit line.

By using the above-mentioned storage array, a memory cell includes two memories, one P-channel field effect transistor and two N-channel field effect transistors alternately connected to the P-channel field effect transistor; a source of the P-channel field effect transistor is connected to a drain of a N-channel field effect transistor; a drain of the P-channel field effect transistor is connected to a source of the N-channel field effect transistor, accordingly a drive capability of a circuit when a high level is inputted can be increased, thereby solving the driving problem and contributing to further improving the density of the storage array.

In order to achieve the above and related purposes, one or more aspects of the present disclosure include limitations described in detail later. Some exemplary aspects of the present disclosure are described in detail in the following description and the accompanying drawings. However, these aspects indicate merely some of the various modes in which the principle of the present disclosure may be used.

In addition, the present disclosure is intended to include all these aspects and equivalents thereof.

BRIEF DESCRIPTION OF THE DRAWINGS

The other purposes and results of the present disclosure will become clearer and easier to understand by reference to the description below in conjunction with the accompanying drawings and with more comprehensive understanding of the present disclosure. In the accompanying picture.

DETAILED DESCRIPTION

In the following description, for the purpose of illustration, many specific details are described in order to provide a comprehensive understanding of one or more embodiments. However, it is obvious that these embodiments may also be implemented without these specific details. In other examples, for ease of describing one or more embodiments, well-known structures and devices are shown in a block diagram form.

In a current N-type transistor storage array, a maximum gate voltage that can be applied to a transistor in the storage array is limited, and when the N-type transistor has a source resistor, a non-zero source voltage further reduces a gate-source voltage of the transistor. Therefore, there exists a problem that a driving current is insufficient during the operation of the dual-port memory at an advanced node. In order to address the above problem, the present disclosure provides a storage array, in which a memory cell includes two memories, and one P-channel field effect transistor and two N-channel field effect transistors alternately connected to the P-channel field effect transistor. A source of the P-channel field effect transistor is connected to a drain of the N-channel field effect transistor, and a drain of the P-channel field effect transistor is connected to a source of the N-channel field effect transistor. Accordingly, a storage device can be driven by two N-channel metal oxide semiconductor (NMOS) devices in parallel, thereby increasing a drive capability of a circuit when a high level is inputted, solving the driving problem, which contributes to further improving the density of the storage array.

In the description of the present disclosure, a line connected to a gate of a transistor is referred to as a Word Line (WL), a line connected to a source of the transistors is referred to as a Source Line (SL), and a line connected to one end of a device is referred to as a Bit Line (BL).

In order to detail the storage array in the present disclosure, the specific embodiments of the present disclosure will be elaborated below with reference to the accompanying drawings.

Figure 1:
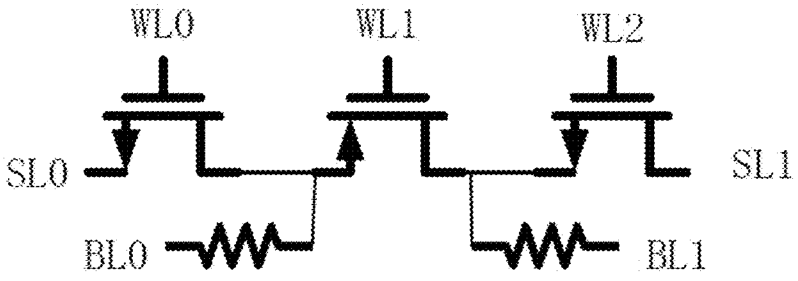
FIG. 1 is a schematic structure diagram of a memory cell of a storage array according to an embodiment of the present disclosure.
Figure 2:
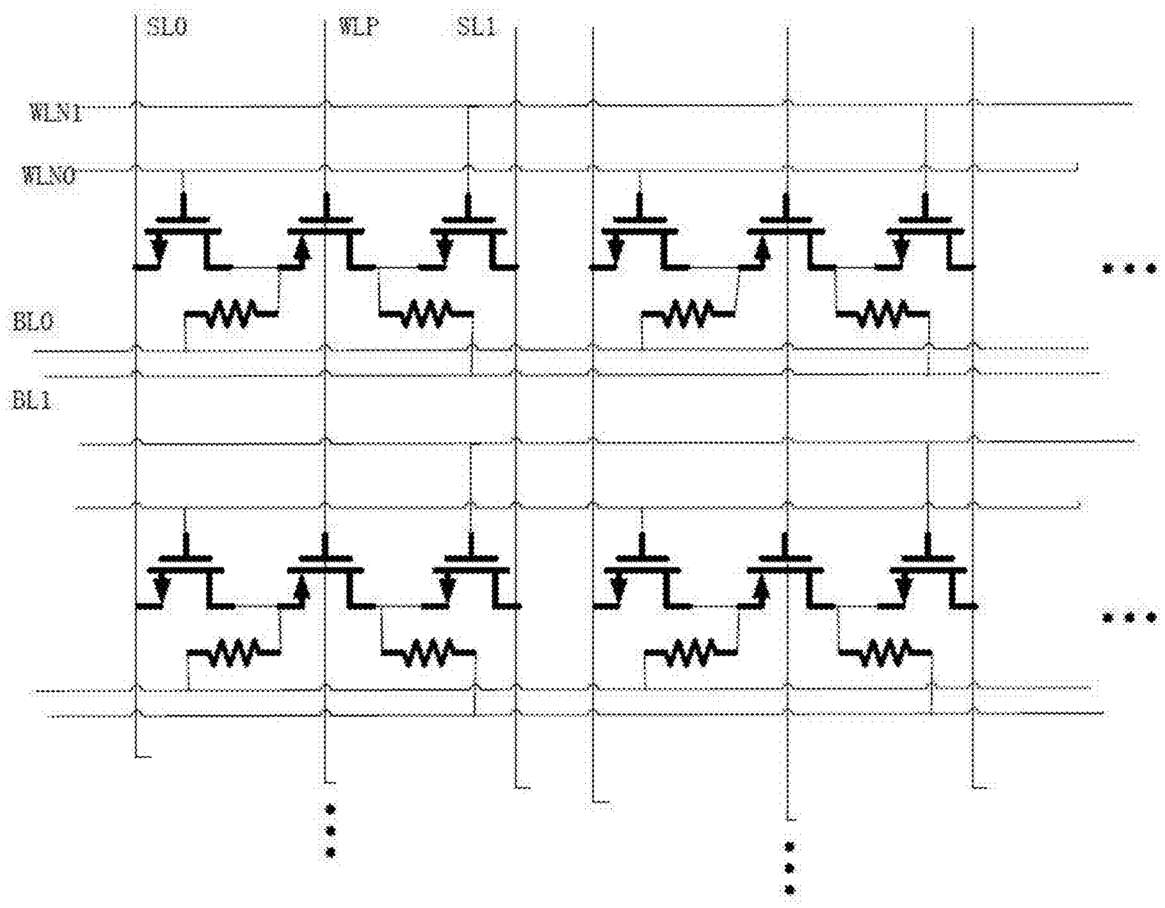
FIG. 2 is a schematic structure diagram of a matrix array of a storage array according to an embodiment of the present disclosure.

FIG. 1 shows a schematic structure diagram of a memory cell of a storage array, and FIG. 2 shows a schematic structure diagram of a matrix array of the storage array according to the embodiments of the present disclosure.

As shown in FIG. 1 and FIG. 2, a storage array in the embodiment of the present disclosure includes memory cells arranged in a matrix array, and each memory cell further includes two memories, and one P-channel field effect transistor (PMOS) and two N-channel field effect transistors (NMOS) alternately connected to the P-channel field effect transistor. The P-channel field effect transistor is connected between the two N-channel field effect transistors. The source of the P-channel field effect transistor is connected to a drain of the N-channel field effect transistor, a drain of the P-channel field effect transistor is connected to a source of the N-channel field effect transistor, and the two memories are respectively connected to the source of the P-channel field effect transistor and the source of the N-channel field effect transistor.

Specifically, in the structure shown in FIG. 1, the memory cell may include a first N-channel field effect transistor, a first P-channel field effect transistor, and a second N-channel field effect transistor connected in sequence. Gates of the first N-channel field-effect transistor, the second N-channel field-effect transistor, and the first P-channel field-effect transistor are respectively connected to different WLs. The source of the first N-channel field-effect transistor and the source of the second N-channel field-effect transistor are respectively connected to different SLs.

A gate of the first N-channel field effect transistor is connected to a word line WL0, a gate of the first P-channel field-effect transistor is connected to a word line WL1, and a gate of the second N-channel field-effect transistor is connected to a word line WL2. The source lines include a source line SL0 connected to the source of the first N-channel field effect transistor and a source line SL1 connected to a drain of the second N-channel field effect transistor. The memories include a first memory connected to the source of the P-channel field effect transistor and a second memory connected to the source of the N-channel field effect transistor. The first memory is connected to a bit line BL0, and the second memory is connected to a bit line BL1.

In addition, in the present disclosure, it is equivalent to that one PMOS in the center is connected to two 1T1R units, the conduction of the field effect transistor can be controlled by signals on the WL0, the WL1, and the WL2, and operating voltages applied on the SL and the BL can achieve reading and writing of the memories in the memory cell.

For a PMOS serving as a gating device, a source line is connected to a positive voltage VDD, so that the positive voltage can be effectively transmitted. In this case, a saturation current of the first P-channel field effect transistor is represented as follows:

$$I_{max} = \left(\frac{Kw}{L}\right)_p * (V_{sg} - V_{tp})^2,$$

where $$V_{sg} = V_s < VDD, \left(\frac{Kw}{L}\right)_p$$

and $V_{tp}$ represent inherent parameters of the first P-channel field effect transistor, $V_{sg}$ represents the source-gate voltage of the first P-channel field effect transistor, $V_s$ represents the source voltage of the first P-channel field effect transistor. Accordingly, when PMOS transmits the positive voltage, since $V_{sg}$ is affected by a voltage at the other end, the PMOS gate-source voltage drop can reach VDD. For the NMOS, the maximum PMOS gate-source voltage drop is only VDD−I*R, where a typical value of I*R is equal to 0.7V. In this case, the saturation current of the PMOS device is significantly greater than that of an NMOS device with the same size. In other words, a divided voltage of the PMOS device is much smaller than that of the NMOS device when the same current flows through the PMOS device and the NMOS device.

In the memory cell shown in FIG. 1, when both the SL0 and the SL1 are connected to the positive voltage, and all field effect transistors are turned on, it can be regarded as two NMOS devices in parallel to drive the device, thereby solving the problem of insufficient drive capability of the conventional transistors, and contributing to further improving the storage density.

FIG. 2 shows a typical storage array structure formed by the memory cells as shown in FIG. 1, the memory cells in the same row share the same WLN0, WLN1, BL0, and BL1, and the memory cells in the same column share the same WLP, SL0, and SL1. The specific connection relationship between two rows and two columns is shown in the figure. The specific storage array structure may also include M×N memory cells, where M represents the number of rows, N represents the number of columns, the word lines include a word line N connected to the gate of the N-channel field effect transistor and a word line P connected to the gate of the P-channel field effect transistor. The memory cells in the same row share the word line N and a bit line, and the memory cells in the same column share the word line P and a source line.

In a specific implementation mode of the present disclosure, the storage array has four operating modes: a storage mode, a write-1 mode, a write-0 mode, and a read mode. In the storage mode, each memory cell does not operate and maintains its own original data. In the write-1 mode and the write-0 mode, specified memory cells are respectively in a state-1 and a state-0, and voltages of the specified memory cells are less than a preset voltage VDD. In the read mode, the source lines of the memory cells are connected to a read voltage, so that a read current reaches the bit lines through the memory cells, and corresponding states of the memory cells are read from the bit lines.

Specifically, in the storage mode, all word lines N, bit lines, and source lines are connected to the GND, and the word lines P are connected to the preset voltage VDD. Both the P-channel field effect transistors and the N-channel field effect transistors are in an off state. In the write-1 mode, the word line N is connected to the preset voltage VDD, and the word line P is connected to the GND. After a target memory cell is strobed, a source line of the target memory cell is connected to a preset write-1 voltage, a target bit line of the target memory cell is connected to the GND, the rest of the bit lines are connected to the write-1 voltage, and then the target memory cell is written to the state-1. In the write-0 mode, the word line N is connected to the preset voltage VDD, the word line P and the source line are connected to the GND. After the target memory cell is strobed, a bit line of the target memory cell is connected to the preset write-0 voltage, source lines of other memory cells are connected to the preset write-0 voltage, and the write current flows from the bit lines through the target memory cell to the source line, so that the target memory cell is written to the state-0. In the read mode, the word line N is connected to the preset voltage VDD, and the source line is connected to the read voltage. After the target memory cell is strobed, the read current flows from the source line through the target memory cell to the bit line, and a corresponding state of the memory cell is read from the bit line.

Figure 3:
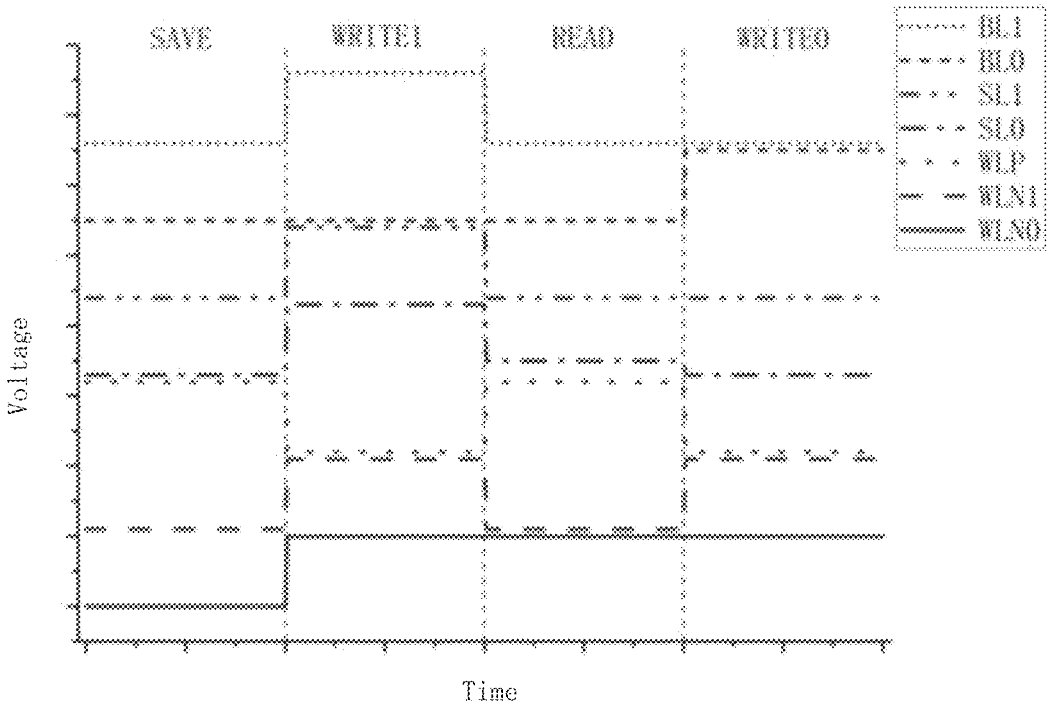
FIG. 3 is a schematic diagram of an operating voltage of a storage array according to an embodiment of the present disclosure.

As a specific example, FIG. 3 shows a schematic structure of an operating voltage of a storage array according to an embodiment of the present disclosure.

With reference to FIG. 1 to FIG. 3, the storage array includes four operating modes: the storage mode, the write-1 mode, the write-0 mode, and the read mode. It is assumed that the memory is written to 1 when a positive voltage is applied to the SL, while the memory writes 0 when a positive voltage is applied to the BL. In the following, VDD and GND respectively refer to a high level in the circuit and the ground. Specifically, it is assumed that a target device currently operated is a left side device in the (0, 0) memory cell in the upper left corner of FIG. 2. The operation procedure is as shown in FIG. 3, the storage array is in a non-operating state with data stored at an initial stage, subsequently operations of writing 1, reading, and writing 0 are successively performed on the specified unit.

Specifically, in the non-operating state, all WLNs, BLs, and SLs are connected to the GND, and all WLPs are connected to the VDD. In this case, all transistors are in an off state, and the array does not operate.

Write-1 mode: for the (0, 0) memory cell, WLN0 and WLN1 are connected to the VDD; WLP and BL0 are connected to the GND; SL0, SL1 and BL1 are connected to the write-1 voltage, and SLIs of other memory cells are connected to the write-1 voltage. The connections of other lines are the same as that in the non-operating state. In this case, all MOSs in the (0, 0) memory cell are turned on, the write current flows from SL0 and SL1 through a target memory to BL0, and no current flows through other memories, and the target memory is written to 1.

Read mode: for the (0, 0) memory cell, the WLN0 is connected to the VDD and the SL0 is connected to the read voltage, and the connections of other lines are the same as that in the non-operating state. In this case, the NMOS on the left side in the (0, 0) memory cell is turned on, and the read current flows from the SL0 through the target memory to the BL0, and a corresponding state of the target memory can be read from the BL0.

Write-0 mode: for the (0, 0) memory cell, WLN0 and WLN1 are connected to the VDD, WLP is connected to the GND, SL0, SL1, and BL1 are connected to the GND, BL0 is connected to the write-0 voltage, SL0*s* of other memory cells are connected to the write-0 voltage, and connections of other lines are the same as that in the non-operating state. In this case, all MOSs in the (0, 0) memory cell are turned on, the write current flows from the BL0 through the target memory to the SL0 and the SL1, and no current flows through other memories, and the target memory is written to 0.

It should be noted that the aforementioned description of the present disclosure only explains a method for operating a single memory cell in the array once, and only one row and one column of memory cells are strobed each time. A person of ordinary knowledge in the art should understand that the operation method may be easily extended to multiple rows and multiple columns of memory cells, so that read and write operations can be performed on multiple rows and multiple columns of units in parallel, thereby increasing a data throughput of the array.

According to the aforementioned storage array of the present disclosure, a single memory cell includes two memories, one P-channel field effect transistor and two N-channel field effect transistors alternately connected to the P-channel field effect transistor. The source of the P-channel field effect transistor is connected to the drain of the N-channel field effect transistor, the drain of the P-channel field-effect transistor is connected to the source of the N-channel field-effect transistor, and accordingly, the memories can be driven by two NMOS devices in parallel, thereby increasing the drive capability when a high level is inputted into the circuit, solving the drive problem, and contributing to further improving the density of the storage array.

It should be further noted that in the present disclosure, relationship terms such as the first and the second are merely used for distinguishing one entity or operation from another, and do not definitely require or imply that there is any such actual relationship or sequence between these entities or operations. Furthermore, the terms "include", "comprise" or any other variant thereof are intended to cover non-exclusive inclusion such that a process, method, article or device that includes a series of elements includes not only those elements but also other elements that are not explicitly listed, or includes elements inherent in such a process, method, article or device. In the absence of more restrictions, an element defined by the statement "including a . . . " does not exclude other same elements existing in the process, method, article, or device that includes the element.

The above description of embodiments in the present disclosure enables a person skilled in the art to implement or use the present disclosure. It is obvious for those skilled in the art to make various modifications to these embodiments, and the general principle defined herein may be implemented in other embodiments without departing from the spirit or scope of the present disclosure. Therefore, the present disclosure will not be limited to these embodiments shown herein, but is intended to conform to the widest scope consistent with the principle and novel features disclosed herein.

The invention claimed is:

1. A storage array, comprising memory cells arranged in a matrix array, each memory cell comprising two memories, one P-channel field effect transistor, a first N-channel field effect transistor and a second N-channel field effect transistors alternately connected to the P-channel field effect transistor; wherein a source of the P-channel field effect transistor is connected to a drain of the first N-channel field effect transistor, a drain of the P-channel field effect transistor is connected to a source of the second N-channel field effect transistor, and the two memories are respectively configured to be connected to the source of the P-channel field effect transistor and the source of the second N-channel field effect transistor;

wherein the first N-channel field effect transistor, the P-channel field effect transistor, and the second N-channel field effect transistor are connected in sequence; wherein gates of the first N-channel field-effect transistor, the second N-channel field-effect transistor, and the P-channel field-effect transistor are connected to different word lines respectively, and a source of the first N-channel field-effect transistor and a source of the second N-channel field-effect transistor are connected to different source lines respectively;

wherein the storage array comprises M x N memory cells, wherein M represents the number of rows, N represents the number of columns, the word lines comprise a word line N connected to gates of the N-channel field effect transistors and a word line P connected to a gate of the P-channel field effect transistor, wherein the memory cells in the same row are configured to share the word line N and a bit line, and memory cells in the same column are configured to share the word line P and a source line.

2. The storage array according to claim 1, wherein a source line is configured to be connected to a positive voltage VDD, a saturation current of the first P-channel field effect transistor is represented as follows:

$$I_{max} = \left(\frac{Kw}{L}\right)_p * (V_{sg} - V_{tp})^2,$$

where $$V_{sg} = V_s < VDD, \left(\frac{Kw}{L}\right)_p$$

and $V_{tp}$ represent inherent parameters of the first P-channel field effect transistor, $V_{sg}$ represents a source-gate voltage of the first P-channel field effect transistor, $V_s$ represents a source voltage of the first P-channel field effect transistor.

3. The storage array according to claim 1, wherein the memories comprise a first memory and a second memory, the first memory is configured to be connected to the source of the first P-channel field effect transistor, and the second memory is configured to be connected to the source of the second N-channel field effect transistor.

4. The storage array according to claim 1, comprising a storage mode, a write-1 mode, a write-0 mode, and a read mode; wherein in the storage mode, each memory cell is configured to be in a non-operating state and maintain original data thereof, in the write-1 mode and the write-0 mode, specified memory cells are configured to be in a state-1 and a state-0 respectively, wherein voltages of the specified memory cells are less than a preset voltage VDD; and in the read mode, a source line of a memory cell is configured to be connected to a read voltage to allow a read current to reach a bit line through the memory cell and to read a corresponding state of the memory cell from the bit line.

5. The storage array according to claim 4, wherein in the storage mode, all the word lines N, the bit lines, and the source lines are configured to be connected to GND, and the word line P is configured to be connected to the preset voltage VDD; and the P-channel field effect transistor and the N-channel field effect transistors are configured to be in an off state.

6. The storage array according to claim 4, wherein in the write-1 mode, the word line N is configured to be connected to the preset voltage VDD, and the word line P is configured to be connected to GND;

after a target memory cell is strobed, a source line of the target memory cell is configured to be connected to a preset write-1 voltage, a target bit line of the target memory cell is configured to be connected to the GND, the rest of the bit lines are configured to be connected to the write-1 voltage, and the target memory cell is configured to be written to the state-1.

7. The storage array according to claim 4, wherein in the write-0 mode, the word line N is configured to be connected to the preset voltage VDD, the word line P and the source line are configured to be connected to GND; and after a target memory cell is strobed, a bit line of the target memory cell is configured to be connected to a preset write-0 voltage, source lines of other memory cells are configured to be connected to the preset write-0 voltage, a write current flows from the bit line through the target memory cell to the source line, and the target memory cell is configured to be written to the state-0.

8. The storage array according to claim 4, wherein in the read mode, the word line N is configured to be connected to the preset voltage VDD, and the source line is configured to be connected to the read voltage; and after a target memory cell is strobed, a read current flows from the source line through the target memory cell to the bit line, and a corresponding state of the memory cell is read from the bit line.

* * * * *